United States Patent
Grimone, III

(10) Patent No.: US 7,667,525 B2
(45) Date of Patent: Feb. 23, 2010

(54) BUS SWITCH CIRCUIT WITH BACK-GATE CONTROL DURING POWER DOWN

(75) Inventor: Leo J. Grimone, III, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 465 days.

(21) Appl. No.: 11/099,965

(22) Filed: Apr. 6, 2005

(65) Prior Publication Data

US 2006/0226887 A1 Oct. 12, 2006

(51) Int. Cl.
*H03K 17/687* (2006.01)

(52) U.S. Cl. ......................... 327/427; 327/434

(58) Field of Classification Search ................ 327/404, 327/427, 434; 326/113, 81, 83
See application file for complete search history.

(56) References Cited

U.S. PATENT DOCUMENTS

| | | | | |
|---|---|---|---|---|
| 5,963,080 A | * | 10/1999 | Miske et al. | 327/534 |
| 6,034,553 A | * | 3/2000 | Kwong | 326/86 |
| 6,100,719 A | | 8/2000 | Graves et al. | 326/86 |
| 6,335,653 B1 | * | 1/2002 | Shigehara et al. | 327/534 |

* cited by examiner

*Primary Examiner*—Quan Tra
(74) *Attorney, Agent, or Firm*—John J. Patti; Wade J. Brady, III; Frederick J. Telecky, Jr.

(57) ABSTRACT

The bus switch with back gate control circuit includes: an NMOS transistor coupled between a first port and a second port; a PMOS transistor coupled in parallel with the NMOS transistor; a first blocking device coupled between the first port and a control node of the PMOS transistor; a second blocking device coupled between the second port and the control node of the PMOS transistor; a first pull-down device coupled to a back gate of the NMOS transistor; and a second pull-down device coupled to the back gate of the NMOS transistor, wherein the pull down device is controlled by a power supply node and the control node of the PMOS transistor.

5 Claims, 1 Drawing Sheet

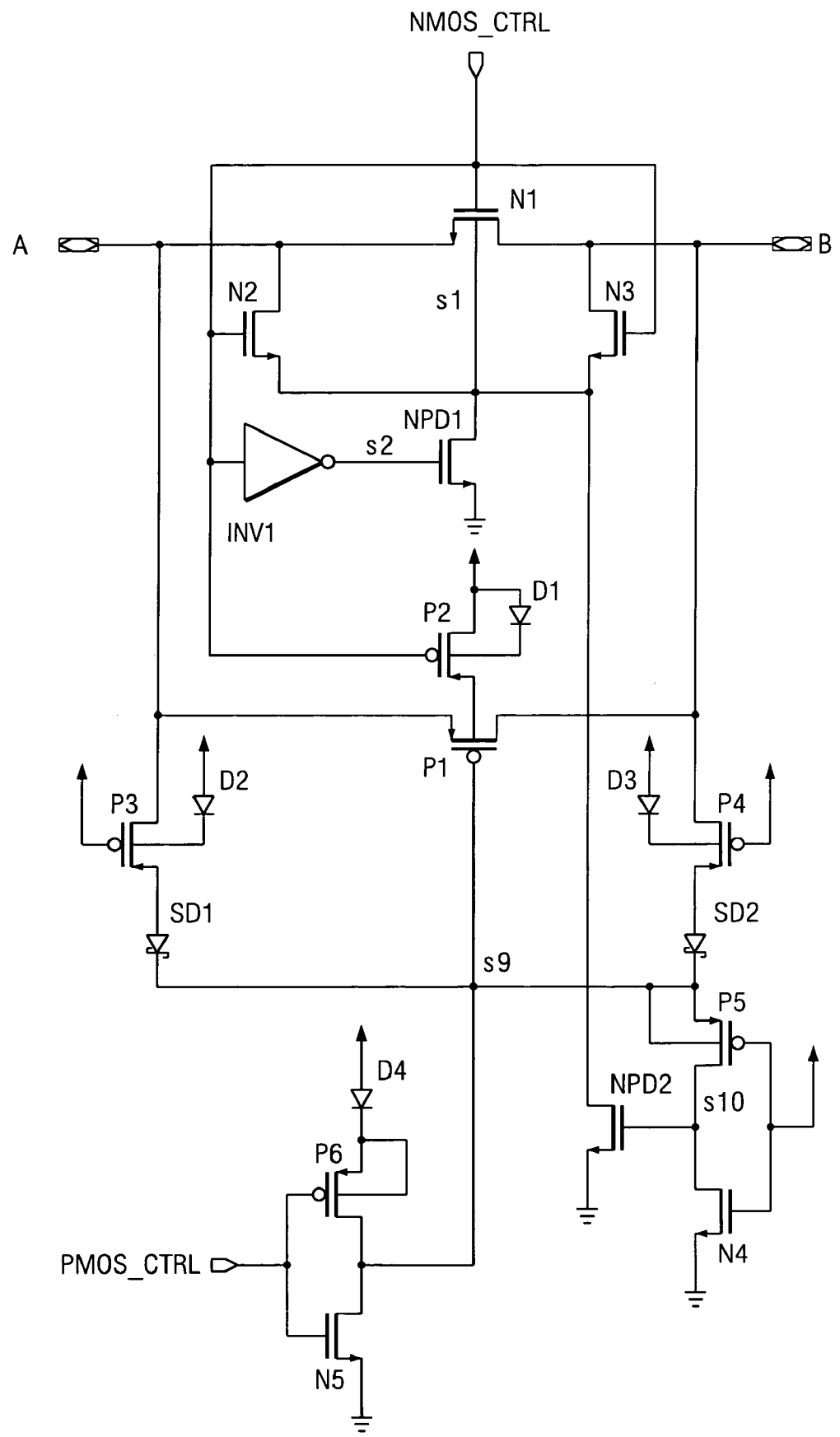

US 7,667,525 B2

BUS SWITCH CIRCUIT WITH BACK-GATE CONTROL DURING POWER DOWN

FIELD OF THE INVENTION

The present invention relates to electronic circuitry and, in particular, a bus switch circuit with back-gate control.

BACKGROUND OF THE INVENTION

On resistance (Ron) flatness is a concern in analog switches and one way to achieve a flatter Ron is by allowing the back-gate of the NMOS transistor to increase in voltage, producing a stronger transistor with less resistance. To allow the back-gate to rise an NMOS transistor is used as a switch to connect and disconnect the back-gate to its source. The drawback with this is during a power down condition the back-gate will be left floating and will allow higher leakage through the pass transistor.

SUMMARY OF THE INVENTION

The bus switch with back gate control circuit includes: an NMOS transistor coupled between a first port and a second port; a PMOS transistor coupled in parallel with the NMOS transistor; a first blocking device coupled between the first port and a control node of the PMOS transistor; a second blocking device coupled between the second port and the control node of the PMOS transistor; a first pull-down device coupled to a back gate of the NMOS transistor; and a second pull-down device coupled to the back gate of the NMOS transistor, wherein the pull down device is controlled by a power supply node and the control node of the PMOS transistor.

BRIEF DESCRIPTION OF THE DRAWINGS

In the drawings:

The Drawing is a circuit diagram of a preferred embodiment bus switch with back gate control, according to the present invention.

DETAILED DESCRIPTION OF PREFERRED EMBODIMENTS

The power down circuit, according to the present invention, for bus switch with back-gate control, minimizes the leakage condition. The Drawing shows a preferred embodiment bus switch with back-gate control. The circuit shown in the Drawing includes PMOS transistors P1, P2, P3, P4, P5, and P6; NMOS transistors N1, N2, N3, N4, N5, NPD1, and NPD2; inverter INV1; diodes D1, D2, D3, and D4; Schottky diodes SD1 and SD2; control signals pmos_ctrl and nmos_ctrl; and ports A and B. Transistor P3 and diode SD1 form a blocking circuit. Transistor P4 and diode SD2 form a blocking circuit. Transistors NPD2, PS, and N4 form a pull down device for the back gate of transistor N1. This pull down device is controlled by the power supply and node s9. The preferred embodiment power down circuit provides an improvement over the prior art by accounting for the added leakage that is caused by the back-gate control circuit. Transistor NPD1 is the back-gate pull-down for normal operation. During a powered down condition node S2 will be low and transistor NPD1 will be off allowing node S1 to float. This is where the preferred embodiment circuit comes in. Transistor NPD2 is a pull down that is controlled by a CMOS device (transistors PS and N4). During normal operation, node S10 will be low and transistor NPD2 will be off, but during power down situations transistor PS turns on and allows node S10 to follow node S9, which can be controlled by external sources that maybe connected to port A or port B. Node S10 voltage will follow the higher of the two sources connected to port A and port B through transistor P3 and diode SD1, or transistor P4 and diode SD2, respectively. With either external source going high, transistor NPD2 will turn on, and node S1 will be held low and the potential between the back-gate of transistor N1 and its drain and source will be at its greatest. This condition will minimize the leakage through transistor N1.

The preferred embodiment device provides several advantages. It handles floating nodes that were created by the back-gate control in the prior art. And, it's small, simple, straight forward and uses very little area.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A bus switch circuit comprising:
   a first terminal;
   a second terminal;
   a first NMOS transistor that is coupled to the first terminal at its source and the second terminal at its drain;
   a second NMOS transistor that is coupled to the first terminal at its drain;
   a third NMOS transistor that is coupled to the second terminal at its drain;
   a first PMOS transistor that is coupled to the first terminal at its drain;
   a second PMOS transistor that is coupled to the second terminal at its drain;
   a third PMOS transistor that is coupled to the sources of the first and second PMOS transistors at its source;
   a fourth NMOS transistor that is coupled to the gate of the third PMOS transistor at its gate; and
   a fifth NMOS transistor that is coupled to the drains of the third PMOS transistor and the fourth NMOS transistor at its gate and the sources of the second and third NMOS transistors at its drain.

2. The bus switch circuit of claim 1, wherein the bus switch circuit further comprises:
   a first zener diode that is coupled between the sources of the first PMOS transistor and the third PMOS transistor; and
   a second zener diode that is coupled between the sources of the second PMOS transistor and the third PMOS transistor.

3. The bus switch circuit of claim 1, wherein the bus switch circuit further comprises:
   an inverter that is coupled to the gate of the first NMOS transistor; and
   a sixth NMOS transistor that is coupled to the sources of the second and third NMOS transistors at its drain and the inverter at its gate.

4. The bus switch circuit of claim 1, wherein the bus switch circuit of claim 1 further comprises a fourth PMOS transistor that is coupled to the first terminal at its source, the second terminal at its drain, and the sources of the first and second PMOS transistors at its gate.

5. A bus switch circuit comprising:
   a first terminal;
   a second terminal;

a first NMOS transistor that is coupled to the first terminal at its source and the second terminal at its drain;

a second NMOS transistor that is coupled to the first terminal at its drain;

a third NMOS transistor that is coupled to the second terminal at its drain;

an inverter that is coupled to the gate of the first NMOS transistor; and a fourth NMOS transistor that is coupled to the sources of the second and third NMOS transistors at its drain and the inverter at its gate;

a first PMOS transistor that is coupled to the first terminal at its drain;

a second PMOS transistor that is coupled to the second terminal at its drain;

a first zener diode that is coupled to the source of the first PMOS transistor;

a second zener diode that is coupled to the source of the second PMOS transistor;

a third PMOS transistor that is coupled to first and second zener diodes at its source;

a fifth NMOS transistor that is coupled to the gate of the third PMOS transistor at its gate;

a sixth NMOS transistor that is coupled to the drains of the third PMOS transistor and the fourth NMOS transistor at its gate and the sources of the second and third NMOS transistors at its drain;

a fourth PMOS transistor that is coupled to the first terminal at its source, the second terminal at its drain, and the sources of the first and second PMOS transistors at its gate;

a fifth PMOS transistor that is coupled to the gate of the fourth PMOS transistor at its drain;

and a seventh NMOS transistor that is coupled to the gate of the fourth PMOS transistor at its drain and the gate of the fifth PMOS transistor at its gate.

* * * * *

UNITED STATES PATENT AND TRADEMARK OFFICE
CERTIFICATE OF CORRECTION

PATENT NO.       : 7,667,525 B2                                              Page 1 of 1
APPLICATION NO.  : 11/099965
DATED            : February 23, 2010
INVENTOR(S)      : Leo J. Grimone, III It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 173 days.

Signed and Sealed this

Twenty-eighth Day of December, 2010

David J. Kappos
*Director of the United States Patent and Trademark Office*